(12) United States Patent
Park

(10) Patent No.: US 9,826,636 B2
(45) Date of Patent: Nov. 21, 2017

(54) TRANSPARENT ELECTRODE AND MANUFACTURING METHOD THEREOF

(71) Applicant: INDUSTRY-ACADEMIC COOPERATION FOUNDATION, YONSEI UNIVERSITY, Seoul (KR)

(72) Inventor: Jin Woo Park, Seoul (KR)

(73) Assignee: INDUSTRY-ACADEMIC COOPERATION FOUNDATION, YONSEI UNIVERSITY, Seoul (KR)

( * ) Notice: Subject to any disclaimer, the term of this patent is extended or adjusted under 35 U.S.C. 154(b) by 0 days.

(21) Appl. No.: 14/989,412

(22) Filed: Jan. 6, 2016

(65) Prior Publication Data

US 2016/0198571 A1 Jul. 7, 2016

(30) Foreign Application Priority Data

Jan. 6, 2015 (KR) ........................ 10-2015-0001307

(51) Int. Cl.
| | |
|---|---|
| *H05K 1/09* | (2006.01) |
| *H05K 3/00* | (2006.01) |
| *H05K 3/20* | (2006.01) |
| *H01L 51/44* | (2006.01) |
| *H05K 1/02* | (2006.01) |

(52) U.S. Cl.
CPC ........... *H05K 1/092* (2013.01); *H01L 51/444* (2013.01); *H05K 3/0014* (2013.01); *H05K 3/207* (2013.01); *H05K 1/0274* (2013.01); *H05K 2201/0108* (2013.01); *H05K 2201/026* (2013.01); *H05K 2201/0376* (2013.01); *Y02E 10/549* (2013.01)

(58) Field of Classification Search
USPC ........................................... 174/251
See application file for complete search history.

(56) References Cited

U.S. PATENT DOCUMENTS

| | | | | |
|---|---|---|---|---|
| 5,525,857 A | * | 6/1996 | Gnade | H01J 1/3042 313/309 |
| 8,018,563 B2 | * | 9/2011 | Jones | B82Y 10/00 252/500 |
| 2003/0214697 A1 | * | 11/2003 | Duthaler | G02F 1/167 359/296 |
| 2005/0003640 A1 | * | 1/2005 | Ushiyama | H01L 27/12 438/502 |
| 2006/0084206 A1 | * | 4/2006 | Moriya | H05K 3/1258 438/149 |

(Continued)

FOREIGN PATENT DOCUMENTS

| | | |
|---|---|---|
| CN | 103109391 B | 7/2016 |
| JP | 2011-029035 A | 2/2011 |

(Continued)

OTHER PUBLICATIONS

Communication dated Mar. 6, 2017 by the Korean Patent Office in counterpart Korean Patent Application No. 10-2015-0001307.

(Continued)

*Primary Examiner* — William H Mayo, III
*Assistant Examiner* — Krystal Robinson
(74) *Attorney, Agent, or Firm* — Sughrue Mion, PLLC

(57) ABSTRACT

Disclosed is a transparent electrode including a transparent substrate 100, conductive nanowires 10 forming networks, nanoparticles bonding the nanowires 10, and a conductive layer embedded in the transparent substrate 100.

14 Claims, 13 Drawing Sheets

(56) References Cited

U.S. PATENT DOCUMENTS

| | | | |
|---|---|---|---|
| 2007/0274895 A1* | 11/2007 | Jesih | B82Y 30/00 |
| | | | 423/462 |
| 2008/0152873 A1* | 6/2008 | Okoroanyanwu | B82Y 10/00 |
| | | | 428/195.1 |
| 2009/0129004 A1* | 5/2009 | Gruner | H01L 31/02246 |
| | | | 361/679.21 |
| 2010/0112546 A1* | 5/2010 | Lieber | A61B 5/14546 |
| | | | 435/5 |
| 2012/0132930 A1* | 5/2012 | Young | H01L 31/0481 |
| | | | 257/84 |
| 2015/0027755 A1* | 1/2015 | Tsujimoto | B82Y 30/00 |
| | | | 174/253 |

FOREIGN PATENT DOCUMENTS

| | | | |
|---|---|---|---|
| JP | 2011029035 A * | 2/2011 |
| KR | 10-2011-0071534 A | 6/2011 |
| KR | 10-2013-0026643 A | 3/2013 |
| KR | 10-1470752 B1 | 12/2014 |
| WO | 2012/040637 A2 | 3/2012 |

OTHER PUBLICATIONS

Communication dated Mar. 30, 2017 by the Chinese Patent Office in counterpart Chinese Patent Application No. 201610007195.1.

\* cited by examiner

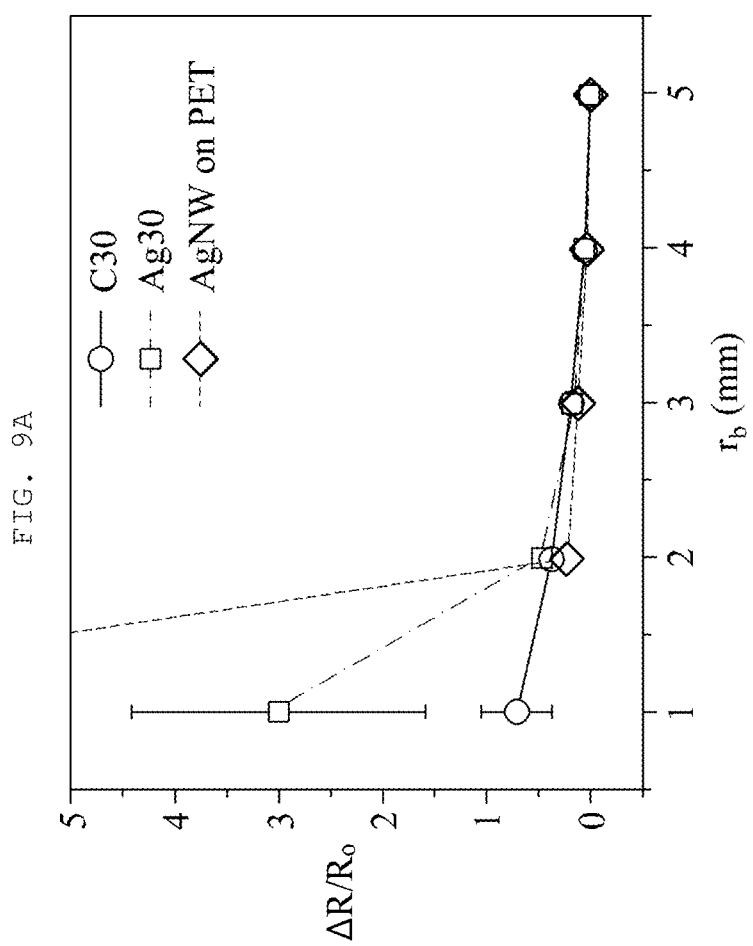

TRANSPARENT ELECTRODE AND MANUFACTURING METHOD THEREOF

CROSS-REFERENCE TO RELATED APPLICATION

This application claims the priority benefit of Korean Patent Application No. 10-2015-0001307, filed on Jan. 6, 2015 in the Korean Intellectual Property Office, the disclosure of which is incorporated herein by reference.

BACKGROUND OF THE INVENTION

Field of the Invention

The present disclosure relates to a transparent electrode and a method of manufacturing the same, and more particularly to a transparent electrode including conductive nanowires and porous nanoparticles and having low sheet resistance, enhanced adhesion to a substrate, enhanced dispersion, and low surface roughness, and a method of manufacturing the same.

Description of the Related Art

Research into electronic devices having flexibility and elasticity is actively underway as portability of electronic equipment is emphasized. A variety of flexible electronic devices have been developed as a result of such research. A flexible display is a representative example of such flexible electronic devices.

A flexible display can be freely bent or folded due to flexibility thereof, thus being applicable to a variety of portable electronic equipment such as mobile phones. In such a flexible display, a flexible and transparent electrode is used. Indium-tin oxide (ITO) is mainly utilized as a conductive oxide of such a transparent electrode.

An indium-tin oxide (ITO) thin film used in transparent electrodes has superior conductivity and transparency, but is brittle. Accordingly, when the indium-tin oxide (ITO) thin film is bent or folded, there are problems such as crack occurrence and thus mechanical stability is decreased, which may cause sheet resistance increase.

In addition, upon use of such an indium-tin oxide (ITO) thin film, manufacturing costs are high due to scarcity of indium as a material of the indium-tin oxide (ITO) thin film.

So as to address the aforementioned problems of an indium-tin oxide (ITO) thin film, a related patent document described below suggests a transparent electrode to which carbon nanotubes (CNTs) as a thin film are applied.

However, existing transparent electrodes including carbon nanotubes are very sensitive to moisture, thus easily adsorbing moisture. Accordingly, sheet resistance is greatly increased and thus over-coating is required.

In addition, carbon nanotubes have superior flexibility, compared to indium-tin oxide (ITO), but have poor electrical and optical characteristics.

Accordingly, as a solution to address existing problems occurring in a transparent electrode, a technique of large-area coating of a variety of nanowires, such as silver nanowire networks (AgNWs) or nanowire meshes on a flexible polymer substrate using various solution coating techniques and a method of utilizing such a technique were suggested.

However, nanowire meshes have problems such as chemical bonding with a material on the electrode, limitation of uniform interfacial contact due to rough surfaces thereof ($R_{rms}$), and electrical short occurrence in device construction due to partial non-contact with a longitudinal section.

In addition, nanowire-based electrodes have highly variable sheet resistance (Rs) due to non-uniform characteristics of nanowire meshes.

RELATED DOCUMENT

Patent Document

KR10-2013-0026643

SUMMARY OF THE INVENTION

Therefore, the present invention has been made in view of the above problems, and it is an object of the present invention to provide a transparent electrode including a conductive layer that includes conductive nanowires and porous nanoparticles to have low sheet resistance, enhanced adhesion to a substrate, enhanced dispersion, and low surface roughness.

It is another object of the present invention to provide a transparent electrode including a conductive layer embedded in a polymer transparent substrate to have superior bending stability against repeated bending.

In accordance with the present invention, the above and other objects can be accomplished by the provision of a transparent electrode including a transparent substrate; conductive nanowires forming networks; nanoparticles binding the nanowires to one another; and a conductive layer embedded in the transparent substrate.

In the transparent electrode according to the present disclosure, the nanoparticles may mediate transfer from a release substrate to the transparent substrate based on strong attraction to the conductive nanowires.

In addition, in the transparent electrode according to the present disclosure, the transparent substrate may have flexibility.

In addition, in the transparent electrode according to the present disclosure, the transparent substrate may have an optical transmittance of about 80 to about 95%.

In addition, in the transparent electrode according to the present disclosure, the nanowires may be composed of any one of silver (Ag), gold (Ag) and copper (Cu).

In addition, in the transparent electrode according to the present disclosure, the nanoparticles may be porous nanoparticles formed with a plurality of pores, and a concentration ratio of the nanowires to the porous nanoparticles may be about 0.8 to about 1.2% by weight.

In addition, in the transparent electrode according to the present disclosure, the nanoparticles may be aerogel and the aerogel may be silica aerogel.

In addition, in the transparent electrode according to the present disclosure, silver (Ag) atoms of the silver (Ag) nanowires may be dispersed inside pores of the porous nanoparticles to form conductive channels.

In addition, in the transparent electrode according to the present disclosure, the conductive layer may be embedded in the transparent substrate.

In accordance with an aspect of the present invention, the above and other objects can be accomplished by the provision of an electronic device including conductive nanowires forming networks; and a transparent electrode that includes a conductive layer composed of nanoparticles binding the nanowires to one another and is embedded in a transparent substrate.

In addition, in the electronic device according to an embodiment of the present disclosure, the nanoparticles may mediate transfer from a release substrate to the transparent substrate based on strong attraction to the conductive nanowires.

In addition, in the electronic device according to an embodiment of the present disclosure, the nanoparticles may be porous nanoparticles formed with a plurality of pores, and a concentration ratio of the nanowires to the porous nanoparticles may be about 0.8 to about 1.2% by weight.

In addition, in the electronic device according to an embodiment of the present disclosure, the nanoparticles may be aerogel.

In addition, in the electronic device according to an embodiment of the present disclosure, the electronic device may be any one of a flexible display, an organic solar cell, an organic light-emitting diode, a touch panel, and a thin film heater.

In accordance with yet another aspect of the present invention, there is provided A method of manufacturing a transparent electrode, the method including mixing conductive nanowires forming networks and nanoparticles binding the nanowires to prepare a dispersion; coating the dispersion on a release substrate to form a conductive layer; coating the conductive layer with a polymer for embedding; hardening the polymer to form a transparent substrate in which the conductive layer is embedded; and removing the release substrate from the transparent substrate and the conductive layer.

In addition, in the method of manufacturing a transparent electrode according to an embodiment of the present disclosure, the nanowires may be composed of any one of silver (Ag), gold (Ag) and copper (Cu).

In addition, in the method of manufacturing a transparent electrode according to an embodiment of the present disclosure, the nanowires and the nanoparticles may be mixed such that a concentration ratio of the nanowires to the porous nanoparticles is about 0.8 to about 1.2% by weight upon preparation of the dispersion.

In addition, in the method of manufacturing a transparent electrode according to an embodiment of the present disclosure, the nanoparticles may be aerogel and the aerogel may be silica aerogel.

In addition, in the method of manufacturing a transparent electrode according to an embodiment of the present disclosure, silver (Ag) atoms of the silver (Ag) nanowires may be dispersed inside pores of the porous nanoparticles to form conductive channels.

In addition, in the method of manufacturing a transparent electrode according to an embodiment of the present disclosure, the conductive layer, the dispersion may be coated on the release substrate and then a solvent may be evaporated through heat treatment.

Further, in the method of manufacturing a transparent electrode according to an embodiment of the present disclosure, the release substrate may be any one of a silicon substrate and a glass substrate.

The above and other objects, features and other advantages of the present invention will be more clearly understood from the following detailed description taken in conjunction with the accompanying drawings.

Terms or words used herein shall not be limited to having common or dictionary meanings, and should be understood as having meanings and concepts corresponding to technical aspects of the embodiments of the present invention so as to most suitably express the embodiments of the present invention based on the principle that inventors can properly defined concepts of the used terms to describe their invention.

BRIEF DESCRIPTION OF THE DRAWINGS

The above and other objects, features and other advantages of the present invention will be more clearly understood from the following detailed description taken in conjunction with the accompanying drawings, in which:

FIG. 9A and FIG. 9B illustrate bending test results for composite meshes of porous nanoparticles and Ag nanowires according to an embodiment of the present disclosure.

DETAILED DESCRIPTION OF THE INVENTION

Figure 1:
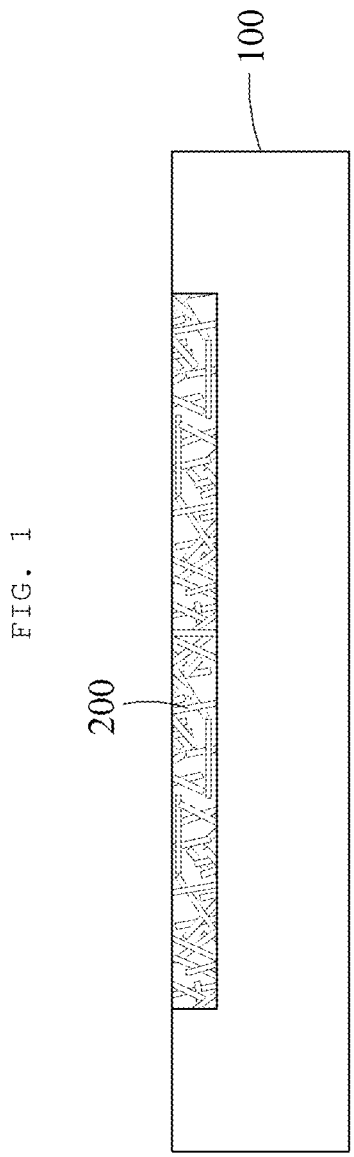
FIG. 1 illustrates a sectional view of a transparent electrode according to an embodiment of the present disclosure.

The following detailed descriptions and exemplary embodiments will now be described more fully with reference to the accompanying drawings to clarify aspects, features and advantages of the inventive concept.

Like reference numerals indicate like elements throughout the drawings. It will be understood that, although the terms first, second, etc. may be used herein to describe various elements, these elements should not be limited by these terms. These terms are only used to distinguish one element from another element. In the following description of the present invention, a detailed description of known functions and configurations incorporated herein will be omitted when it may make the subject matter of the present invention unclear.

Hereinafter, preferred embodiments of the present disclosure will be described in detail with reference to the accompanying figures.

Figure 2:
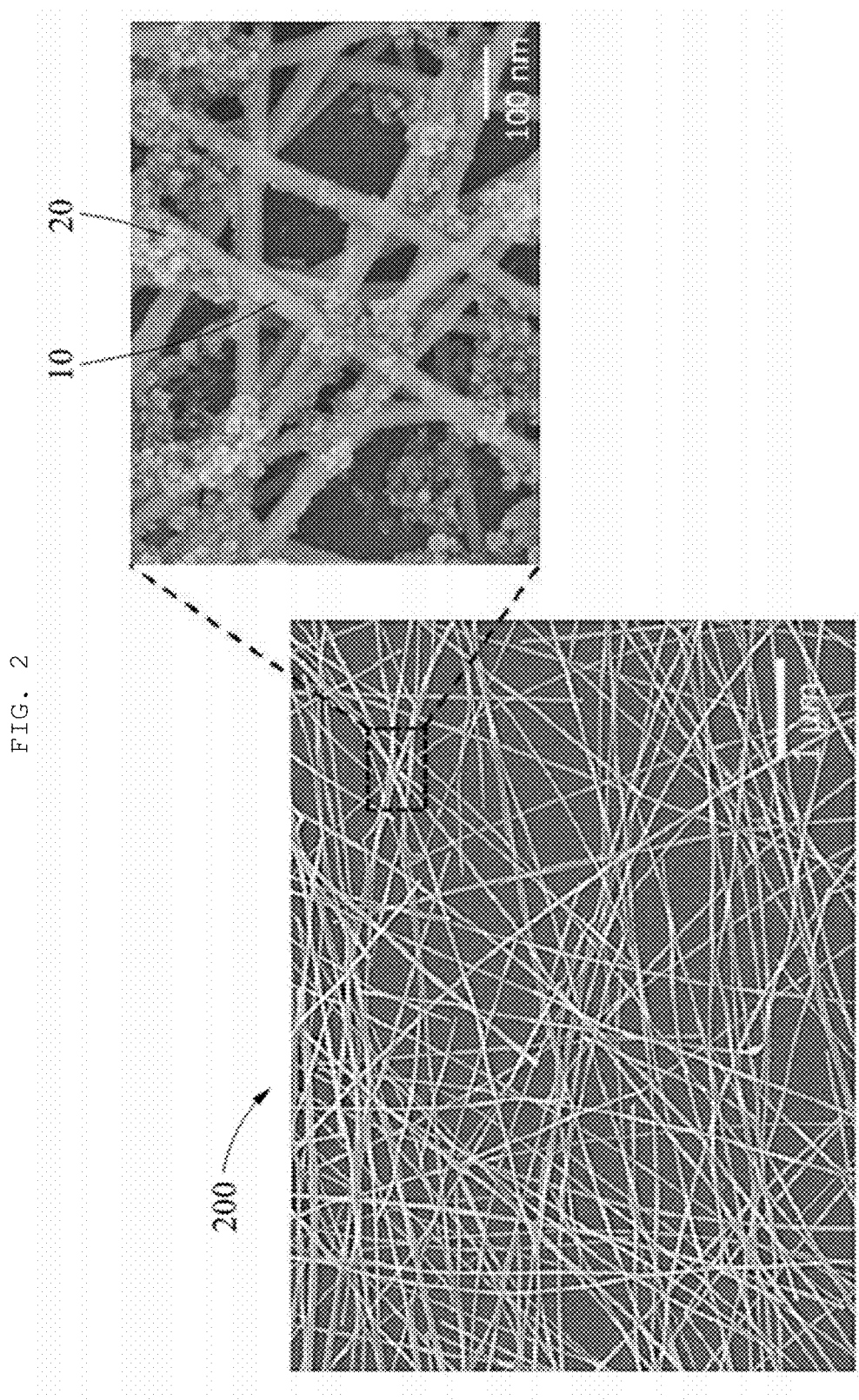
FIG. 2 illustrates a magnified FE-SEM image of the conductive layer illustrated in FIG. 1.

FIG. 1 illustrates a sectional view of a transparent electrode according to an embodiment of the present disclosure, and FIG. 2 illustrates a magnified FE-SEM image of the conductive layer illustrated in FIG. 1.

As illustrated in FIGS. 1 and 2, the transparent electrode according to an embodiment of the present disclosure includes a transparent substrate 100, conductive nanowires 10 forming networks, nanoparticles bonding the nanowires 10, and a conductive layer 200 disposed on a transparent substrate 100.

The nanoparticles may be porous nanoparticles including a plurality of pores. Hereinafter, the nanoparticles are described as porous nanoparticles 20.

The transparent electrode according to the present disclosure is an electrode used in displays, devices manufactured through application of a display, etc., and includes the transparent substrate 100 and the conductive layer 200.

Here, the transparent electrode may be a thin film having superior electrical conductivity and an optical transmittance of about 80 to about 95% in a visible light range. Application of the transparent electrode depends upon conductivity with respect to light transmittance. The transparent electrode has been used as an electrode of antistatic films, heat-reflecting films, film heaters, photovoltaic devices, various flat displays, etc.

Recently, the transparent electrode is also receiving attention as an electrode of flexible electronic equipment having flexibility and elasticity, particularly flexible displays. Accordingly, the transparent electrode according to the present disclosure is described as a transparent electrode of a flexible display. However, the transparent electrode according to the present disclosure is not limited to a flexible display electrode and may be used in an electronic device of any one of a flexible display, an organic solar cell, an organic light-emitting diode, a touch panel, and a thin film heater.

Meanwhile, the transparent substrate 100 may be a substrate having an optical transmittance of about 80 to about 95%. The transparent substrate 100 may have flexibility to be used in a transparent flexible display.

For example, the transparent substrate 100 may be made of a polymer that can be freely bent or folded even upon hardening. The polymer may be any one of polyethylene terephthalate (PET), polyethylene naphthalate (PEN), polyimide (PI), polydimethylsiloxane (PDMS), and polyurethane.

In addition, the polymer is not specifically limited so long as it possesses transparency and flexibility suitable for use in transparent flexible displays.

The conductive layer 200 is a thin film formed on or disposed at the transparent substrate 100 and includes the conductive nanowires 10 and the porous nanoparticles 20.

The nanowires 10 may be any one of metallic nanowires which include silver (Ag), gold (Au) and copper (Cu) having superior conductivity. With regard to conductivity, transparency, flexibility, etc. the nanowires 10 are most preferably Ag nanowires (AgNW, 10).

Hereinafter, although the nanowires 10 are described as Ag nanowires, the present invention is not limited thereto. A Ag nanowire as a conductive material substituting for an indium-tin oxide (ITO) thin film and a carbon nanotube used in conventional transparent electrodes exhibits superior conductivity and flexibility, compared to the indium-tin oxide (ITO) thin film or the carbon nanotube. Since the Ag nanowires form networks, the Ag nanowires may be formed at the transparent substrate 100 with a large area, and may be mixed with the porous nanoparticles 20 to form the conductive layer 200.

The porous nanoparticles 20 bind the nanowires 10 to one another and include a plurality of pores. The porous nanoparticles 20 are uniformly coated on networks (AgNW networks) formed by the nanowires 10 to form a composite.

In addition, the porous nanoparticles 20 may be aerogel, more particularly silica aerogel. However, the porous nanoparticles 20 are not limited thereto.

The porous nanoparticles 20 may be easily attached to networks formed by the nanowires 10, particularly junctions of the networks, so that the nanowires 10 are strongly bound to one another. As a result, the conductive layer 200 forms a composite mesh in which the networks formed by the nanowires 10 and the porous nanoparticles 20 are mixed.

The conductive layer 200 may be formed by coating a dispersion on a release substrate. Here, the dispersion may be prepared by mixing a predetermined solvent such as ethanol with the nanowires 10 and the porous nanoparticles 20. Detailed descriptions thereof are given below.

The diameters of the pores formed in the nanoparticles 20 may be 9 to 11 nm. Here, silver (Ag) atoms are dispersed in the interiors of the pores of the nanoparticles 20 to form conductive channels.

In addition, the conductive layer 200 may be formed on or disposed at the transparent substrate 100. For example, the conductive layer 200 may be embedded in the transparent substrate 200. As a result, the conductive layer 200 of the transparent electrode according to the present disclosure may have superior properties, as compared to conventional transparent electrodes composed of only nanowires. Detailed descriptions thereof are given below.

Figure 3:
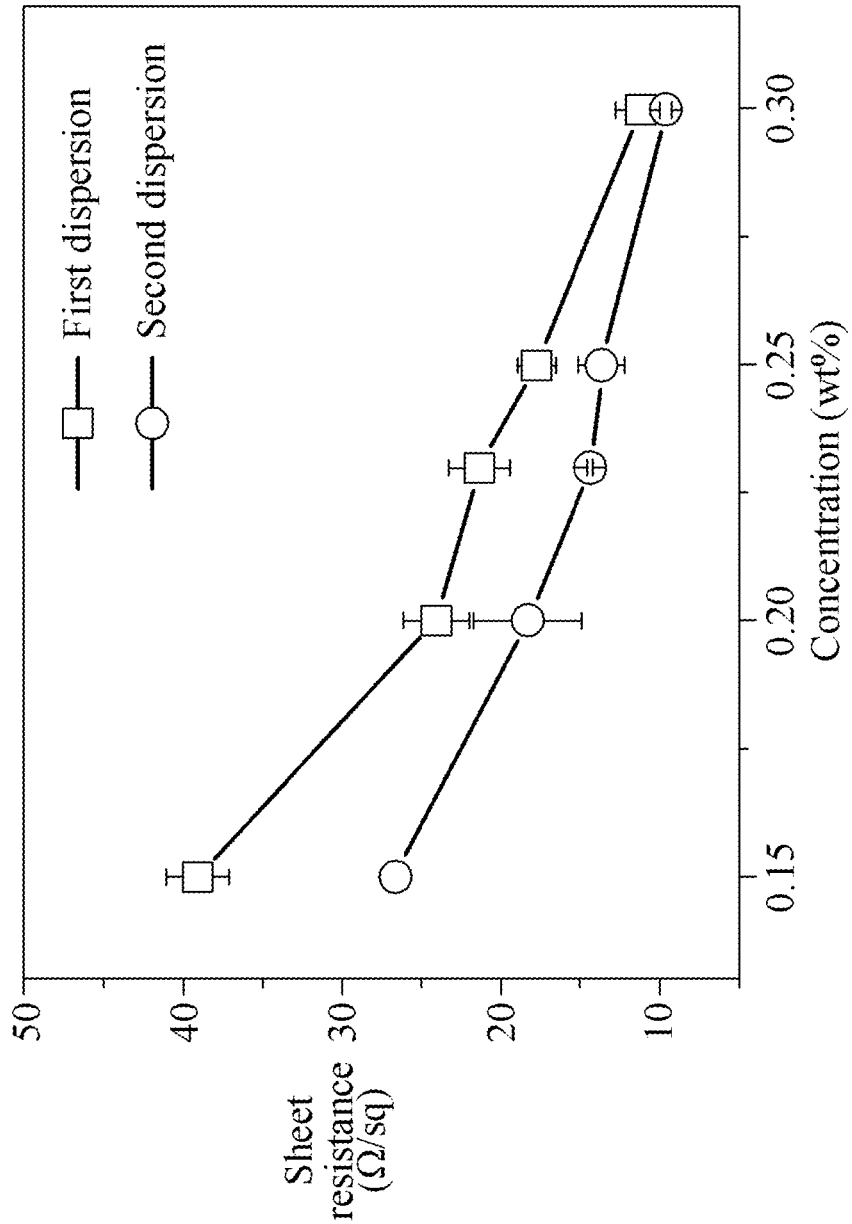
FIG. 3 illustrates a graph representing sheet resistance of an AgNW network and a composite mesh depending upon the concentration of nanowires.

FIG. 3 illustrates a graph representing sheet resistance of a AgNW network and a composite mesh depending upon the concentration of nanowires.

The conductive layer 200 of the transparent electrode according to the present disclosure is formed as a composite mesh, and thus has low sheet resistance.

Referring to FIG. 3, the sheet resistances of a first dispersion prepared by mixing a solvent with only Ag nanowires and a second dispersion prepared by mixing a solvent with Ag nanowires and porous nanoparticles were respectively measured while increasing the concentration of Ag nanowires by about 0.05% by weight.

As illustrated in FIG. 3, it can be confirmed that the sheet resistance of the composite mesh-type conductive layer formed by the second dispersion is lower than that of the conductive layer of the AgNW networks formed from the first dispersion at a given equal concentration.

In addition, it can be confirmed that, in the cases of the first dispersion and the second dispersion, sheet resistance is decreased with increasing concentration (% by weight) of the Ag nanowires. This occurs because insulating spaces are formed among the Ag nanowires of the AgNW networks and such formed insulating spaces are decreased with increasing concentration (% by weight) of the Ag nanowires.

Therefore, the concentration of the Ag nanowires should be increased to reduce sheet resistance, and, due to optical transmittance decrease caused by concentration increase of the Ag nanowires, the concentration of Ag nanowires should be limited to a predetermined level.

On the other hand, the porous nanoparticles do not affect optical transmittance and may reduce sheet resistance through mixing with low-concentration Ag nanowires.

Since the transparent electrode according to the present disclosure includes the composite mesh-type conductive layer embedded in the transparent substrate, superior bending stability against repeated bending is exhibited. This is caused by the porous nanoparticles, which constitute the conductive layer, disposed in the interior of the polymer matrix forming the transparent substrate.

In particular, when compressive stress occurs due to repeated bending, the Ag nanowires move to the interior of the polymer matrix of the transparent substrate and the porous nanoparticles are disposed in the interior of the polymer matrix, whereby movement of Ag nanowires is minimized and thus flexural safety is enhanced.

Figure 4:
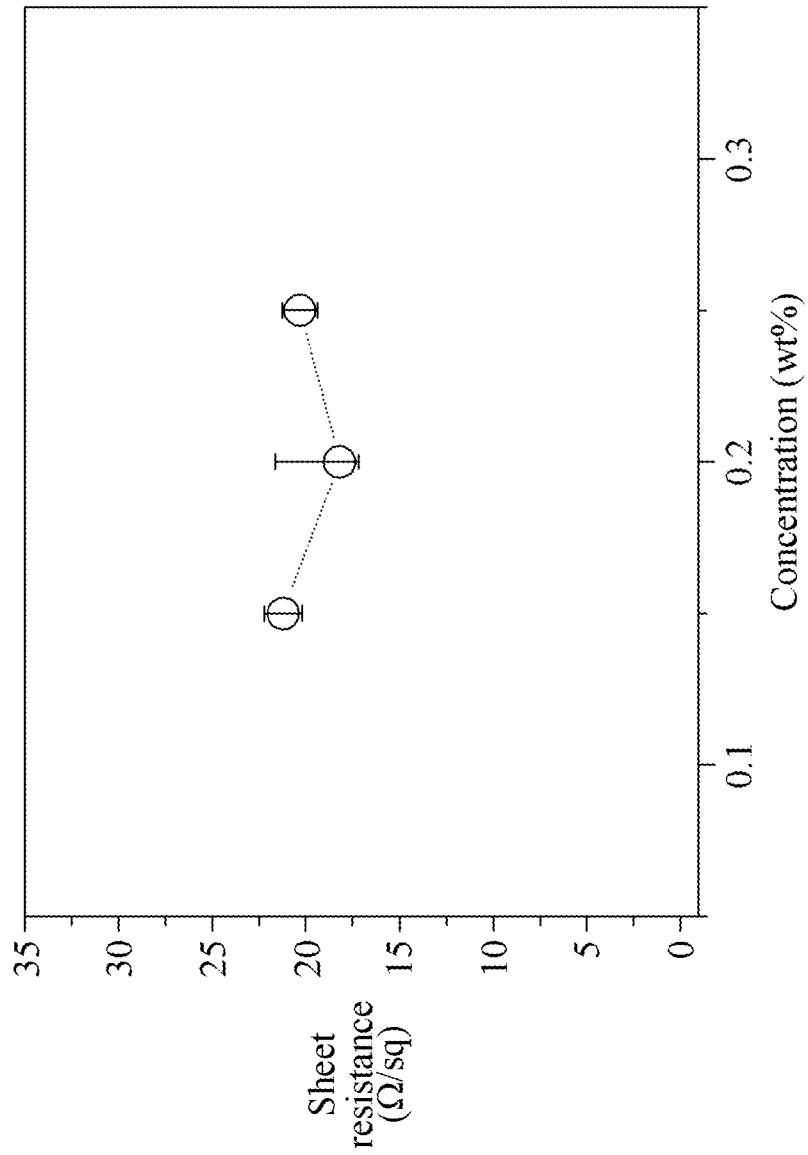
FIG. 4 illustrates a graph representing sheet resistance depending upon the concentration of porous nanoparticles (aerogel)

FIG. 4 illustrates a graph representing sheet resistance depending upon the concentration of porous nanoparticles (aerogel).

In the transparent electrode according to the present disclosure, a concentration ratio (% by weight) of the Ag nanowires to the porous nanoparticles may be about 0.8 to about 1.2. Since the concentration ratio (% by weight) of the Ag nanowires to the porous nanoparticles constituting the conductive layer affects sheet resistance, optimal concentration (% by weight) should be calculated.

In FIG. 4, so as to measure sheet resistance, the concentration of the Ag nanowires is fixed to about 0.2% by weight, and the concentration of the porous aerogel is increased by about 0.05% by weight based on about 0.1% by weight.

Referring to FIG. 4, it can be confirmed that, when a concentration ratio (% by weight) of the Ag nanowires to the porous aerogel is about 1, sheet resistance is lowest.

This occurs because the amount of the porous aerogel is insufficient to coat the release substrate with Ag nanowires when a concentration ratio (% by weight) of the Ag nanowires to the porous aerogel is less than 1.

On the other hand, when a concentration ratio (% by weight) of the Ag nanowires to the porous aerogel is greater than about 1, excess porous aerogel rather disturbs electrical conductivity and thus high sheet resistance is exhibited.

Accordingly, when a concentration ratio (% by weight) of the Ag nanowires to the porous aerogel is about 0.8 to about 1.2, preferably about 0.9 to about 0.1 considering tolerance during a mixing process, optimal sheet resistance is exhibited.

Figure 5:
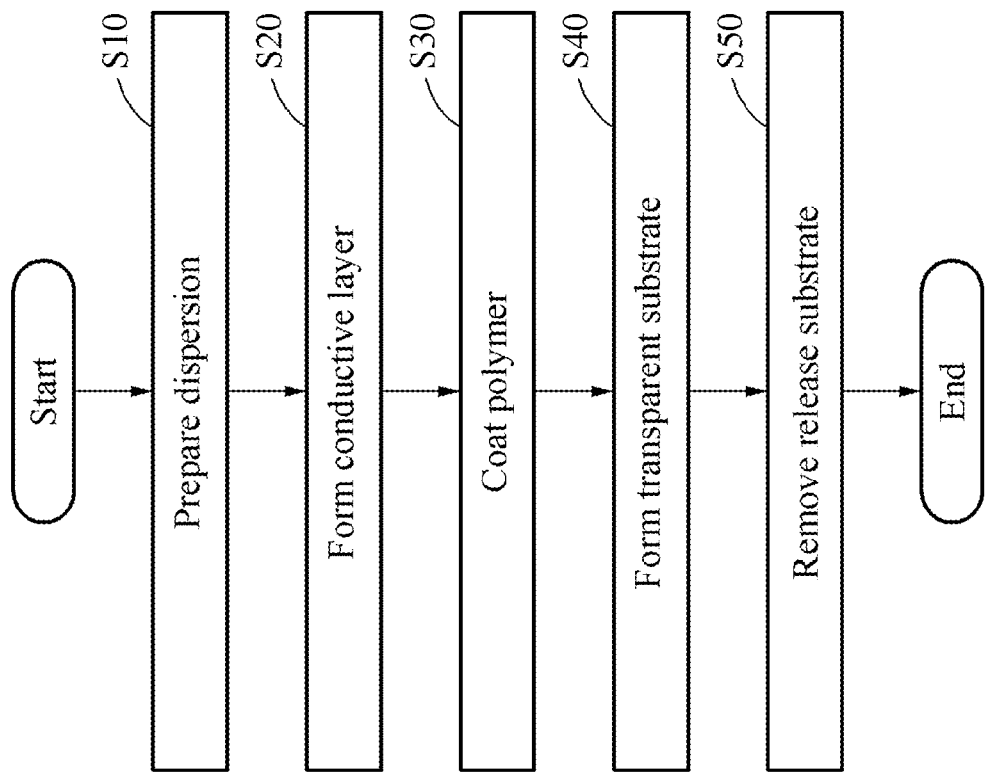
FIG. 5 is a flowchart to describe a method of manufacturing a transparent electrode according to an embodiment of the present disclosure.
Figure 6:
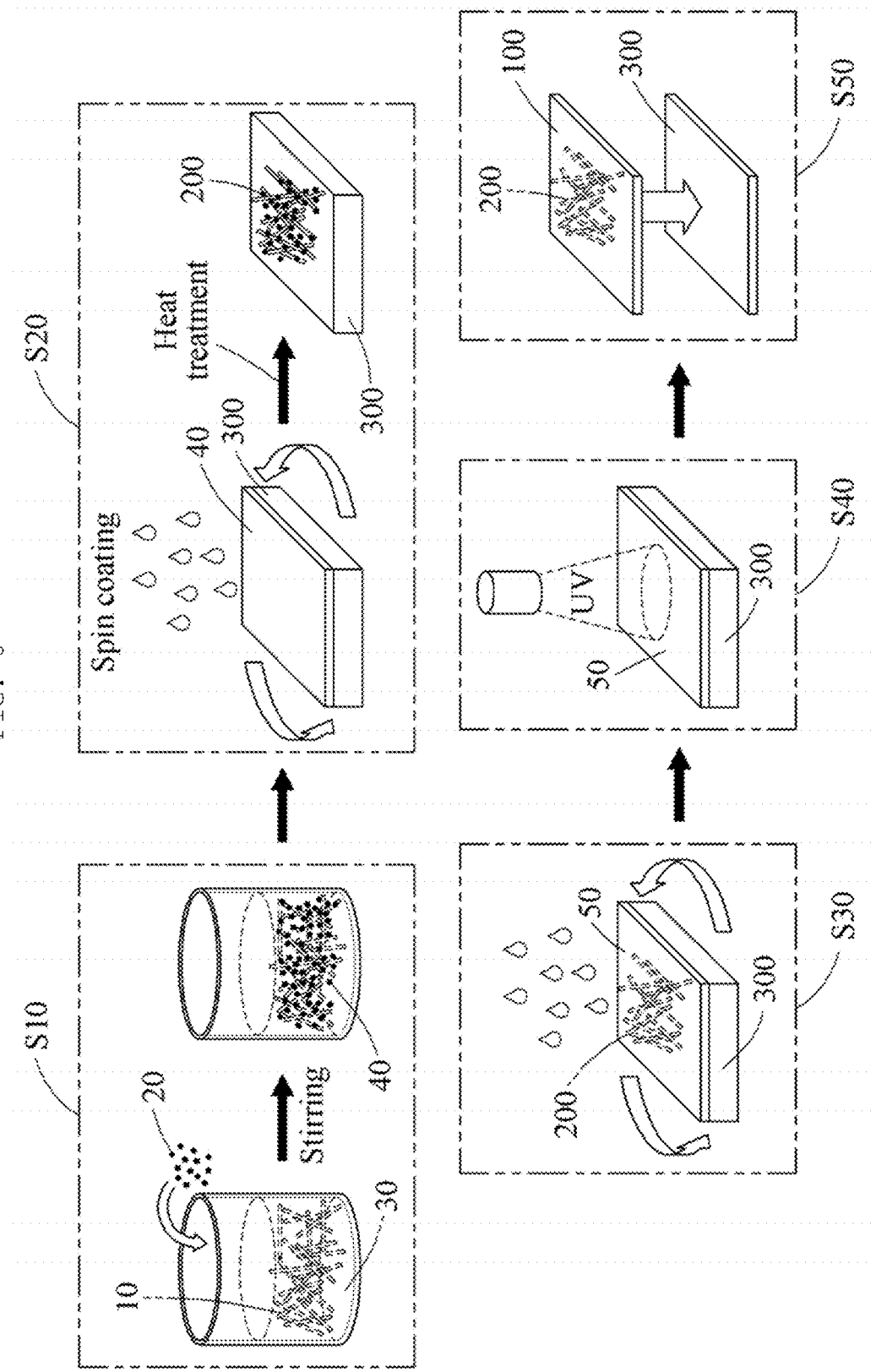
FIG. 6 is a schematic view of a process of manufacturing a transparent electrode according to an embodiment of the present disclosure.

FIG. 5 is a flowchart to describe a method of manufacturing a transparent electrode according to an embodiment of the present disclosure, and FIG. 6 is a schematic view of a process of manufacturing a transparent electrode according to an embodiment of the present disclosure.

Referring to FIGS. 5 and 6, a method of manufacturing the transparent electrode according to an embodiment of the present disclosure includes step S10 of preparing the dispersion 40 by mixing the conductive nanowires 10 forming networks and the porous nanoparticles, which are formed with the pores 20, bonding the nanowires 10 to one another.

Step S10 may be a process of mixing the porous nanoparticles 20 with the nanowires 10. For example, step S10 may be a process of preparing a Ag nanowire solution 30 by mixing the Ag nanowires 10 with ethanol as a solvent.

In this case, the concentration of the Ag nanowires 10 included in the Ag nanowire solution 30 may be about 0.15 to about 0.3% by weight. When the dispersion 40 is prepared by mixing the Ag nanowire solution 30 with the porous nanoparticles 20, a concentration ratio of the Ag nanowires 10 to the porous nanoparticles 20 may be about 0.8 to about 1.2% by weight, preferably about 0.9 to about 1.1% by weight, as described above.

In step S20, the dispersion 40 is coated onto a release substrate 300 to form the conductive layer 200.

For example, step S20 may be carried out by coating the dispersion 40 at 1000 rpm for 60 seconds through spin coating, but the present invention is not limited thereto. The rotation speed and the coating time may be varied and other known coating methods, other than spin coating, may be used.

In addition, step S20 may include a heat treatment process for evaporating and drying a solvent after coating the dispersion 40 on the release substrate 300.

For example, the heat treatment process may be carried out at 100° C. for 20 minutes, but the present invention is not limited thereto. Conditions of the heat treatment process may be determined considering the concentration (% by weight) of the Ag nanowires 10 and the porous nanoparticles 20.

In addition, step S20 may include, after the heat treatment process, a process of forming a thin film-type composite mesh in which the Ag nanowires 10 and the porous nanoparticles 20 are mixed.

For example, the porous nanoparticles 20 are bound to the Ag nanowires 10, so that the Ag nanowires 10 may be bound to one another and a composite mesh may be formed.

In this case, pores of the porous nanoparticles 20 may be formed very minutely in a size of about 9 to about 11 nm. The Ag atoms of the Ag nanowires 10 are dispersed in the interiors of the pores, so that the pores of the porous nanoparticles 20 may form conductive channels.

Subsequently, a polymer 50 is coated on the conductive layer 200 in step S30, and, in step S40, the polymer 50 is hardened to form the transparent substrate 100 in which the conductive layer 200 is embedded.

For example, in step S30, the polymer 50, as material of the transparent substrate 100, may be coated on the conductive layer 200 through spin coating. However, a coating manner is not limited to spin coating and all known solution coating manners may be used.

In addition, in hardening the polymer 50 coated on the conductive layer 200 in step S40, the polymer 50 may be hardened by UV irradiation. For example, the polymer 50 may be hardened during five minutes by means of a UV lamp.

The transparent substrate 100 may be formed through hardening of the polymer 50, and, so as to satisfy predetermined conditions required in the transparent substrate 100, the polymer 50 hardened at 50°C. for 12 hours by means of a hot plate may be subjected to heat treatment.

Therethrough, the polymer 50 is coated and hardened on the conductive layer 200 on the release substrate 300, and thus, the conductive layer 200 may be embedded in the transparent substrate 100.

Subsequently, in step S50, the release substrate 300 is removed from the transparent substrate 100 and the conductive layer 200 to manufacture the transparent electrode according to an embodiment of the present disclosure.

Meanwhile, the release substrate 300 used in the method of manufacturing the transparent electrode according to the present disclosure may be a glass or silicon (Si) substrate. With regard to sheet resistance, the release substrate 300 is preferably a silicon substrate.

In addition, the polymer 50 may be any one of polyethylene terephthalate (PET), polyethylene naphthalate (PEN), polyimide (PI), polydimethylsiloxane (PDMS), and polyurethane, and the porous nanoparticles 20 may be aerogel, particularly silica aerogel, but the present disclosure is not limited thereto.

Figure 7A:
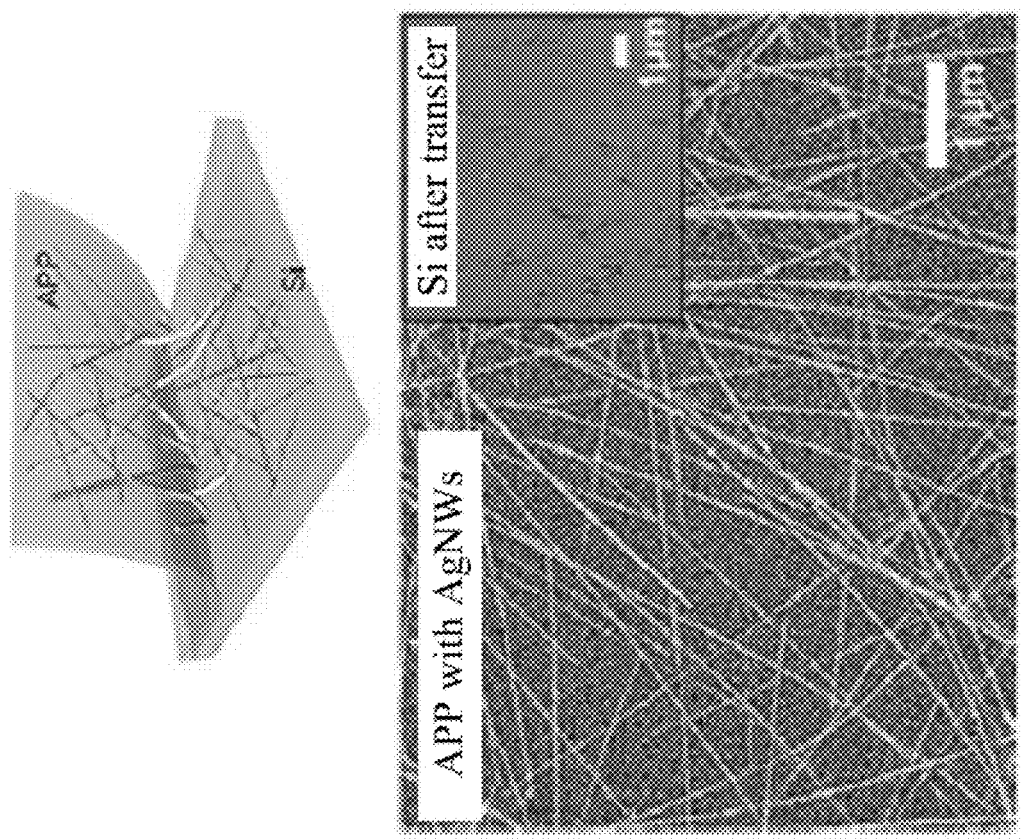
FIG. 7A and FIG. 7B illustrate images of AgNW networks and a composite mesh remaining in a release substrate to describe transfer of a composite mesh according to an embodiment of the present disclosure.
Figure 7B:
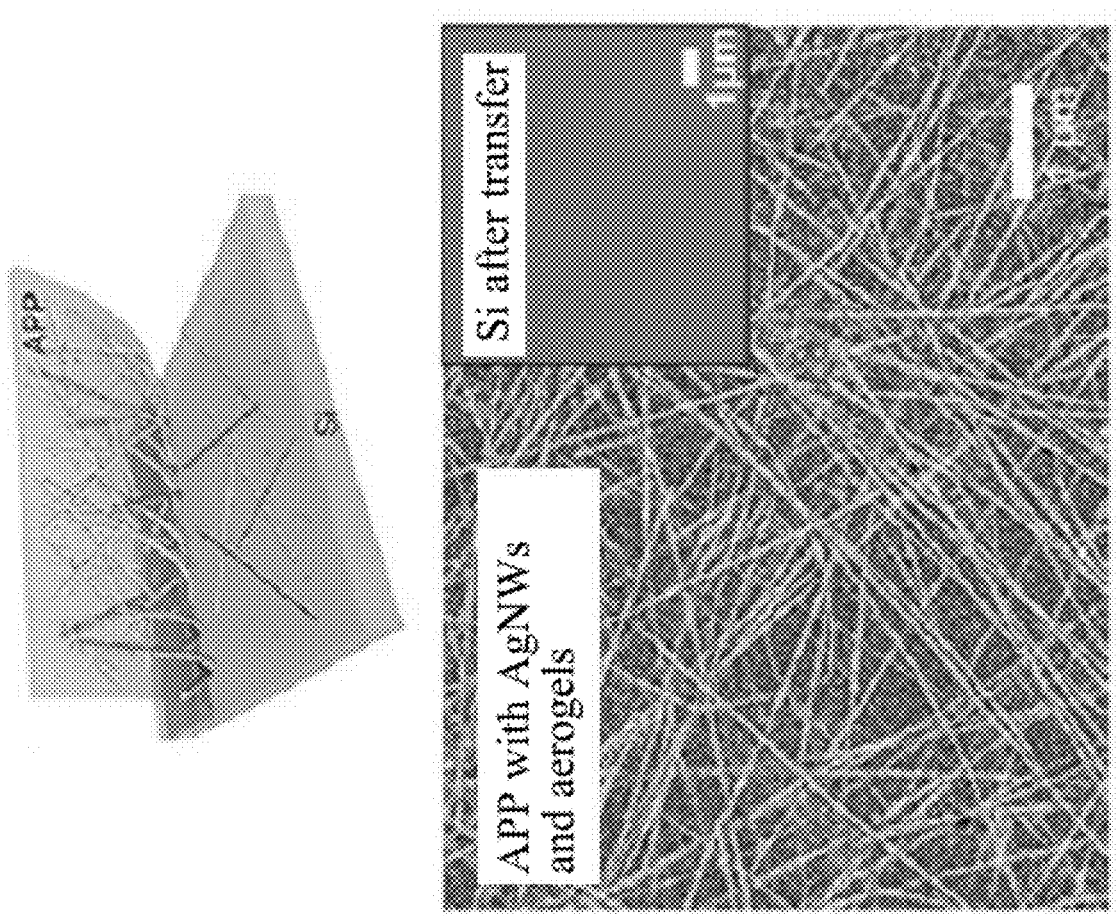

FIG. 7A and FIG. 7B illustrate images of AgNW networks and a composite mesh remaining in a release substrate to describe transfer of a composite mesh according to an embodiment of the present disclosure.

In particular, FIG. 7A illustrates FE-SEM and optical microscopy (OM) images of the conductive layer having the AgNW networks composed of the Ag nanowires, and FIG. 7B illustrates FE-SEM and optical microscopy (OM) photographs of the conductive layer remaining on the release substrate after transfer of the conductive layer as a composite mesh in which the Ag nanowires and the porous nanoparticles are mixed.

Referring to FIG. 7A, it can be confirmed that the AgNW networks remaining in the AgNW network conductive layer are non-uniform throughout an entire area of the release substrate.

However, referring to FIG. 7B, it can be confirmed that the AgNW networks remaining in the composite mesh-type conductive layer are hardly observed in the release substrate.

Therethrough, it can be confirmed that the conductive layer is uniformly transferred to the transparent substrate and transfer efficiency is also increased through interaction between the porous nanoparticles and the Ag nanowires.

This is analyzed as occurring due to the porous nanoparticles which prevent the Ag nanowires from being tangled by cohesion thereof upon mixing of the Ag nanowires with the solvent and drying of the Ag nanowires at the release substrate and are uniformly dispersed in the interior of the polymer matrix constituting the transparent substrate.

In addition, since the porous nanoparticles form the composite mesh with the Ag nanowires and are uniformly embedded in the transparent substrate, surface roughness of the transparent substrate is enhanced.

When a surface of the transparent substrate is very rough, i.e., surface roughness is high, current leaks and the brightness of a light emitting device becomes non-uniform. In addition, it is difficult to process a delicate line with a narrow width in a patterning process constituting a circuit. However, since the conductive layer according to the present disclosure is uniformly embedded in the transparent substrate due to the porous nanoparticles bound to the Ag nanowires, surface roughness of the transparent electrode according to the present disclosure is enhanced.

Additionally, since the conductive layer is uniformly dispersed throughout an overall area of the transparent substrate, the conductive layer has a broad heating area. In addition, temperature is rapidly elevated up to high temperature and cooling is slowly performed due to superior thermal insulation performance of the porous nanoparticles, particularly the silica aerogel.

In the transparent electrode according to the present disclosure, the Ag nanowires and the porous nanoparticles (particularly, silica aerogel) form the composite mesh, and the formed composite mesh is embedded in the transparent substrate, and thus, sheet resistance is decreased, whereby electrical conductivity is increased and surface roughness is enhanced.

In addition, adhesion to the transparent substrate is enhanced, whereby transfer efficiency increases and uniform dispersion may be obtained. In addition, stability against repeated bending and heating performance are enhanced.

Figure 8:
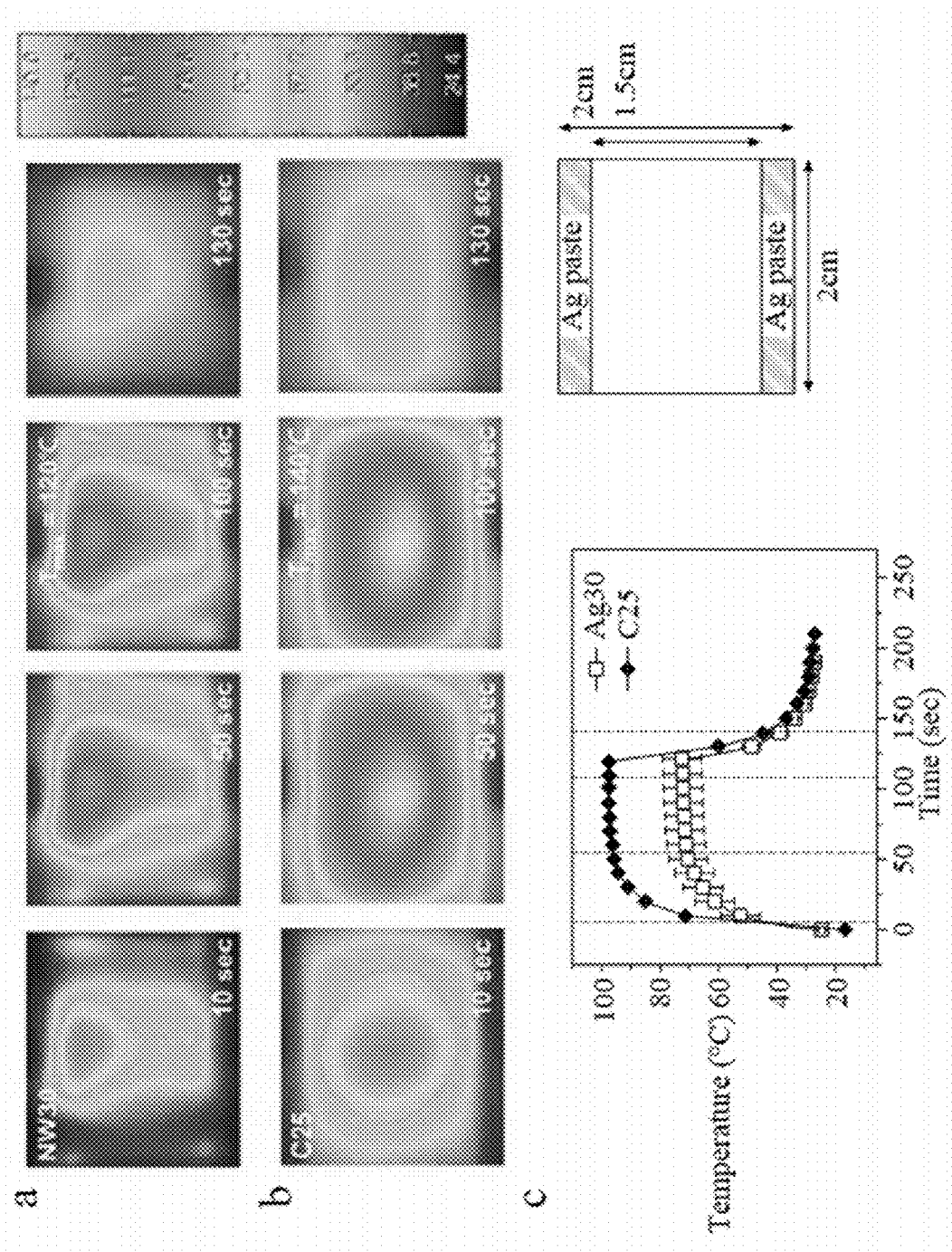
FIG. 8 illustrates IR images describing temperature distribution during a Joule heating test to describe transfer efficiency according to an embodiment of the present disclosure.

FIG. 8 illustrates IR images describing temperature distribution during a Joule heating test to describe transfer efficiency according to an embodiment of the present disclosure.

More particularly, FIG. 8a illustrates IR images when the concentration of the Ag nanowires is about 0.3% by weight (NW30 and Ag30) without the porous nanoparticles (silica aerogel), FIG. 8b illustrates IR images of a composite mesh (C25) in which the concentration of the Ag nanowires is about 0.25% by weight and the concentration of the aerogel is about 0.25% by weight, and FIG. 8c illustrates average temperature variations according to time of FIGS. 8a and b.

Referring to FIGS. 8a and b, it can be confirmed that temperature distribution is radially decreased as going from a center to an edge when uniformly embedded in the substrate. In particular, it can be confirmed that radially decreasing distribution is observed in the case of the composite mesh including the Ag nanowires and the porous nanoparticles (C25), but such a pattern is not observed and non-uniform distribution is observed in the case that the porous nanoparticles are not included (NW30 and Ag30).

In addition, referring to FIG. 8c, it can be confirmed that, in the case of the composite mesh including the Ag nanowires and the porous nanoparticles (C25), maximum temperature is higher, due to high uniformity in temperature distribution, than that in the case that the porous nanoparticles are not included (Ag30).

Figure 9B:
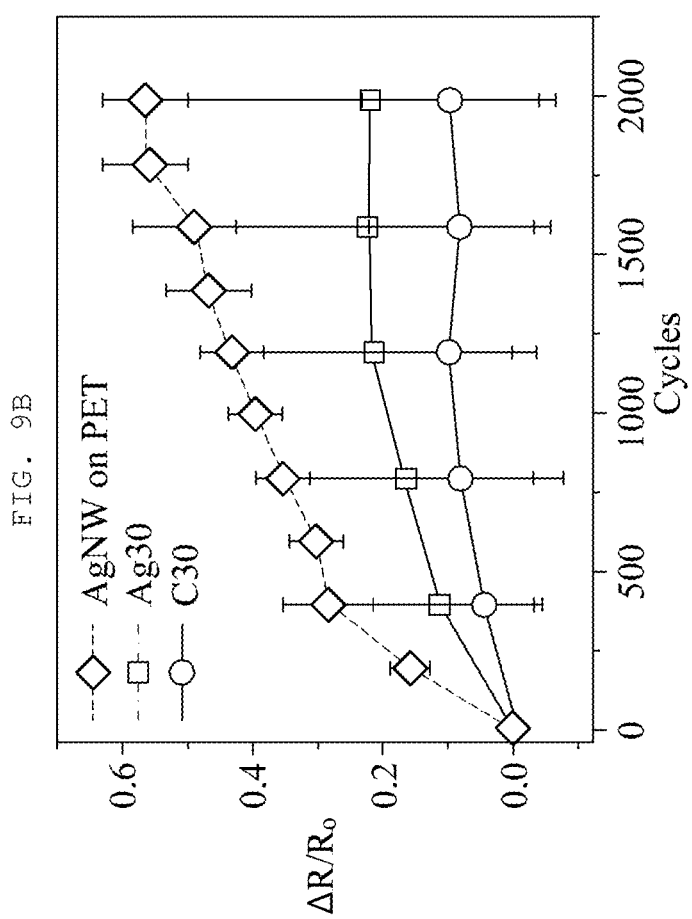

FIG. 9A and FIG. 9B illustrate bending test results for composite meshes of porous nanoparticles and Ag nanowires according to an embodiment of the present invention.

More particularly, FIGS. 9A and 9B illustrate static bending test and cyclic bending test results for the case that the porous nanowires include about 0.3% by weight of the Ag nanowires without the porous nanoparticles (silica aerogel) (Ag30), the case that the embedded composite mesh includes about 0.3% by weight of the Ag nanowires and about 0.3% by weight of the aerogel (C30), and the case that the Ag nanowires are coated on the PET.

Referring to FIG. 9A, it can be confirmed that, in the case that the composite mesh includes the porous nanoparticles and the Ag nanowires (C30) according to an embodiment of the present disclosure, highest bending stability is exhibited, and, in the case that the Ag nanowires are coated on PET, a change rate of Rs tends to be remarkably decreased when $r_b$ is 2 mm or more.

In addition, referring to FIG. 9B, it can be confirmed that, in the case that the Ag nanowires are coated on PET, the R2 change rate further increases, compared to the samples of Ag30 and C30, with increasing cycling frequency. In addition, it can be confirmed that, when a cycle count is about 1000 or more, change rates in Ag30 and C30 are saturated.

In addition, it can be confirmed that C30 exhibits higher mechanical stability than Ag30 after 2000 cycles. For example, it can be confirmed that, after 2000 cycles, an Rs value increases by about 9.5% (1 Ω/sq) in the case of C30, but the Rs value increases by about 22% (5 Ω/sq) in the case of Ag30.

Figure 10A:
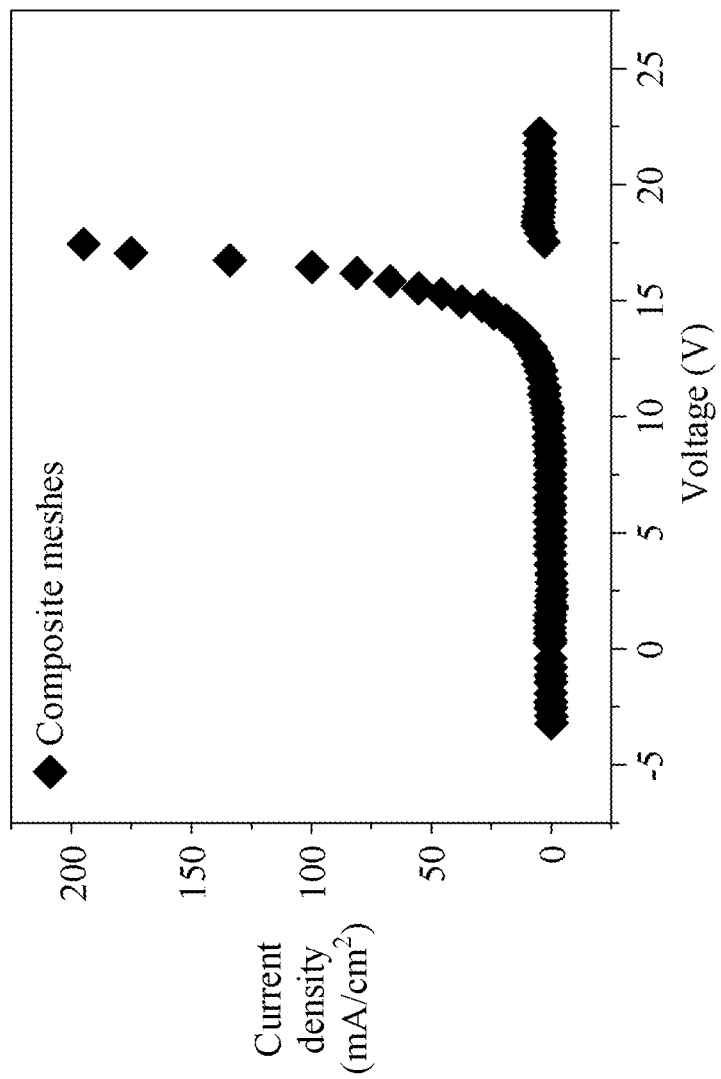
FIGS. 10A and 10B respectively illustrate J-V and L-V graphs of an OLED formed on an embedded composite mesh according to an embodiment of the present disclosure.
Figure 10B:
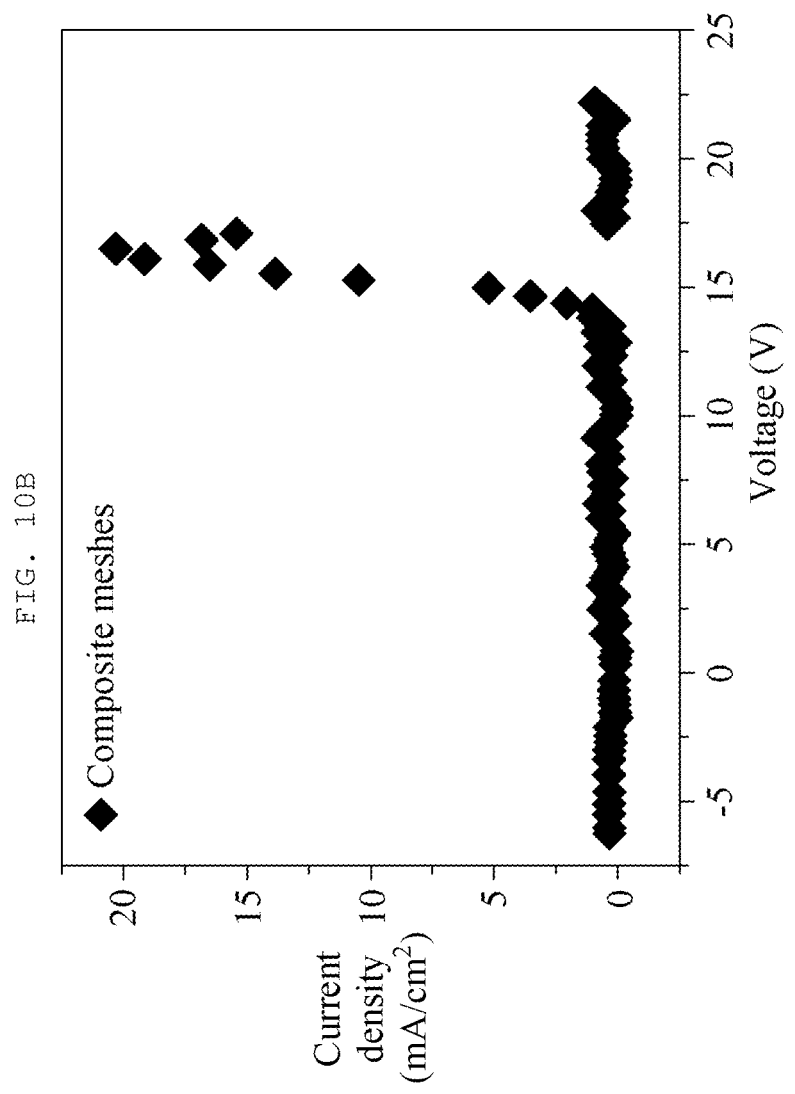

FIGS. 10A and 10B respectively illustrate J-V and L-V graphs of an OLED manufactured on an embedded composite mesh according to an embodiment of the present disclosure.

FIGS. 10A and 10B illustrate J-L-V characteristics of the OLED formed on the embedded composite mesh (C30) including 0.3% by weight of the Ag nanowires and about 0.3% by weight of the aerogel. Thereby, it can be confirmed that characteristics of the transparent electrode according to an embodiment of the present disclosure are satisfactorily realized.

As apparent from the above description, the conductive layer according to the present invention includes the conductive nanowires and the porous nanoparticles, and thus, the conductive nanowires are bound to one another by the porous nanoparticles to form a composite mesh. Accordingly, sheet resistance is decreased, substrate adhesion and dispersion are enhanced, and surface roughness is increased.

In addition, according to the present disclosure, the conductive layer is embedded in the polymer transparent substrate, and thus, the porous nanoparticles are disposed in the interior of the polymer matrix. Accordingly, conductive nanowire movement due to compressive stress is prevented and thus superior stability against repeated bending is exhibited.

The present invention is described in detail by the embodiments, but the present invention is not intended to be limited to the embodiments and those skilled in the art will appreciate that various modifications, additions and substitutions are possible, without departing from the scope and spirit of the invention.

All simple changes and modifications of the present disclosure are understood as within the scope of the present disclosure and the particular scope of the present disclosure will be defined by the following claims.

| [Description of Symbols] | |
|---|---|
| 10: NANOWIRES | 20: NANOPARTICLES |
| 30: NANOWIRE SOLUTION | 40: DISPERSION |
| 50: POLYMER | 100: TRANSPARENT SUBSTRATE |
| 200: CONDUCTIVE LAYER | 300: RELEASE SUBSTRATE |

What is claimed is:

1. A transparent electrode, comprising:
a conductive layer; and
a transparent substrate,
wherein the conductive layer comprises:
conductive nanowires forming networks, and
nanoparticles binding the conductive nanowires to one another,
wherein the conductive nanowires are silver (Ag) nanowires and the nanoparticles are porous nanoparticles attached to junctions of the networks and bonding the Ag nanowires to one another, and
wherein the conductive layer is formed as a composite mesh including the silver (Ag) nanowires and the porous nanoparticles and embedded in the transparent substrate.

2. The transparent electrode according to claim 1, wherein the nanoparticles mediate transfer from a release substrate to the transparent substrate based on strong attraction to the conductive nanowires.

3. The transparent electrode according to claim 1, wherein the transparent substrate has an optical transmittance of about 80 to about 95%.

4. The transparent electrode according to claim 1, wherein a concentration ratio of the Ag nanowires to the porous nanoparticles is about 0.8 to about 1.2% by weight.

5. The transparent electrode according to claim 4, wherein silver (Ag) atoms of the silver (Ag) nanowires are dispersed inside pores of the porous nanoparticles to form conductive channels.

6. The transparent electrode according to claim 1, wherein the nanoparticles are aerogel.

7. An electronic device, comprising:
a transparent electrode that comprises a transparent substrate and a conductive layer comprising conductive nanowires forming networks and nanoparticles, wherein the conductive nanowires are silver (Ag) nanowires and the nanoparticles are porous nanoparticles attached to junctions of the networks and bonding the Ag nanowires to one another, and
wherein the conductive layer is formed as a composite mesh including the silver (Ag) nanowires and the porous nanoparticles binding the Ag nanowires to one another and is embedded in the transparent substrate.

8. The electronic device according to claim 7, wherein the nanoparticles mediate transfer from a release substrate to the transparent substrate based on strong attraction to the conductive nanowires.

9. The electronic device according to claim 7, wherein a concentration ratio of the Ag nanowires to the porous nanoparticles is about 0.8 to about 1.2% by weight.

10. The electronic device according to claim 7, wherein the nanoparticles are aerogel.

11. The electronic device according to claim 7, wherein the electronic device is any one of a flexible display, an organic solar cell, an organic light-emitting diode, a touch panel, and a thin film heater.

12. A method of manufacturing a transparent electrode, the method comprising:
mixing conductive nanowires forming networks and nanoparticles binding the nanowires to prepare a dispersion, wherein the conductive nanowires are silver (Ag) nanowires and the nanoparticles are porous nanoparticles attached to junctions of the networks and bonding the Ag nanowires to one another;
coating the dispersion on a release substrate to form a conductive layer;
coating the conductive layer with a polymer for embedding;
hardening the polymer to form a transparent substrate in which the conductive layer is embedded; and
removing the release substrate from the transparent substrate and the conductive layer,
wherein the conductive layer is formed as a composite mesh including the silver (Ag) nanowires and the porous nanoparticles.

13. The method according to claim 12, wherein, in the coating the dispersion, the dispersion is coated on the release substrate and then a solvent is evaporated through heat treatment.

14. The method according to claim 12, wherein the release substrate is any one of a silicon substrate and a glass substrate.

* * * * *